US007013446B2

(12) United States Patent
Ohba et al.

(10) Patent No.: US 7,013,446 B2
(45) Date of Patent: Mar. 14, 2006

(54) METHOD, PROGRAM, AND APPARATUS FOR DESIGNING A SEMICONDUCTOR DEVICE

(75) Inventors: Hisayoshi Ohba, Kawasaki (JP); Jun Watanabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 75 days.

(21) Appl. No.: 10/606,951

(22) Filed: Jun. 27, 2003

(65) Prior Publication Data

US 2004/0083438 A1 Apr. 29, 2004

(30) Foreign Application Priority Data

Jul. 5, 2002 (JP) .............................. 2002-196865

(51) Int. Cl.
*G06F 17/50* (2006.01)
(52) U.S. Cl. ............................................ 716/10; 716/5
(58) Field of Classification Search .................... 716/2, 716/4, 5, 10
See application file for complete search history.

(56) References Cited

U.S. PATENT DOCUMENTS

| 5,671,152 | A * | 9/1997 | Lavin et al. .................... 716/19 |
| 6,189,130 | B1 * | 2/2001 | Gofman et al. ................. 716/7 |
| 6,205,570 | B1 * | 3/2001 | Yamashita ...................... 716/1 |
| 6,305,000 | B1 * | 10/2001 | Phan et al. ...................... 716/5 |
| 6,567,964 | B1 * | 5/2003 | Shin et al. ...................... 716/8 |
| 6,602,728 | B1 * | 8/2003 | Liebmann et al. ............. 438/16 |
| 6,782,512 | B1 * | 8/2004 | Asakawa ......................... 716/1 |
| 6,792,586 | B1 * | 9/2004 | Li ................................. 716/11 |
| 2002/0071997 | A1 * | 6/2002 | Ahrens et al. .................. 430/5 |
| 2002/0073391 | A1 * | 6/2002 | Yamauchi et al. ............. 716/8 |
| 2002/0116686 | A1 * | 8/2002 | Shin et al. ...................... 716/2 |
| 2002/0157076 | A1 * | 10/2002 | Asakawa ..................... 716/10 |
| 2002/0184606 | A1 * | 12/2002 | Ohba et al. .................... 716/11 |
| 2003/0229875 | A1 * | 12/2003 | Smith et al. ................... 716/10 |
| 2004/0083438 | A1 * | 4/2004 | Ohba et al. .................... 716/2 |
| 2004/0229875 | A1 * | 11/2004 | Cao et al. .................... 514/242 |

OTHER PUBLICATIONS

English Language Abstract JP No. 2001-166452A dated Jun. 22, 2001.
English Language Abstract JP No. 11-265866A dated Sep. 28, 1999.
English Language Abstract JP No. 2001-093980A dated Apr. 6, 2001.

* cited by examiner

*Primary Examiner*—Stacy A. Whitmore
(74) *Attorney, Agent, or Firm*—Staas & Halsey LLP (57) ABSTRACT

A method for designing a semiconductor device in which dummy pattern density and design pattern density are equalized on the entire semiconductor chip. A layout pattern for a layout layer in a semiconductor device is divided into divided areas (step S1). A dummy pattern is inserted between design patterns in the divided areas obtained by dividing the layout pattern (step S2). Dummy pattern density and design pattern density in each divided area are calculated (step S3). Pattern rules for a dummy pattern in each divided area are changed so that the dummy pattern density and the design pattern density will be desired values (step S4).

12 Claims, 7 Drawing Sheets

METHOD, PROGRAM, AND APPARATUS FOR DESIGNING A SEMICONDUCTOR DEVICE

CROSS-REFERENCE TO RELATED APPLICATIONS

This application is based upon and claims the benefits of priority from the prior Japanese Patent Application No. 2002-196865, filed on Jul. 5, 2002, the entire contents of which are incorporated herein by reference.

BACKGROUND OF THE INVENTION

1. Field of the Invention

This invention relates to a method, program, and apparatus for designing a semiconductor device and, more particularly, to a method, program, and apparatus for designing a semiconductor device which insert a dummy pattern between design patterns.

2. Description of the Related Art

The technology of inserting a dummy pattern between design patterns is now essential to controlling variations in the flatness of the surface of a chip or the width of design patterns in semiconductor devices caused by non-uniformity of design pattern density. Therefore, design tools for designing semiconductor devices in which a dummy pattern has been inserted have been provided.

With aluminum wirings, for example, side wall protection films are formed on the side walls of wiring patterns. If wiring pattern density is non-uniform, then side wall protection films of different thicknesses will be formed in the etching process. Accordingly, to make wiring pattern density uniform, design is made by the use of a design tool so that a dummy pattern will be inserted between wiring patterns.

With copper wirings, if wiring pattern density is non-uniform, then the center of a wiring pattern will become depressed at chemical mechanical polishing (CMP) time. Accordingly, to make wiring pattern density uniform, design is made by the use of a design tool so that a dummy pattern will be inserted between wiring patterns.

With conventional design tools, however, a dummy pattern is inserted between design patterns so that dummy pattern density and design pattern density on the entire semiconductor chip will be desired values. Therefore, there may exist an area on a semiconductor chip where a dummy pattern is not inserted, resulting in non-uniform pattern density.

SUMMARY OF THE INVENTION

The present invention was made under the background circumstances as described above. An object of the present invention is to provide a method, program, and apparatus for designing a semiconductor device in which pattern density is equalized on the entire semiconductor chip.

In order to achieve the above object, a method for designing a semiconductor device which uses a computer for inserting a dummy pattern between design patterns is provided. This method for designing a semiconductor device comprises the steps of dividing a layout pattern for a layout layer in a semiconductor device into divided areas, inserting a dummy pattern between design patterns in the divided areas, calculating the density of the dummy pattern and the design patterns in each of the divided areas, and changing pattern rules for the dummy pattern so that the density will be desired values.

Furthermore, in order to achieve the above object, a program for designing a semiconductor device which inserts a dummy pattern between design patterns is provided. This program for designing a semiconductor device makes a computer perform the processes of dividing a layout pattern for a layout layer in a semiconductor device into divided areas, inserting a dummy pattern between design patterns in the divided areas, calculating the density of the dummy pattern and the design patterns in each of the divided areas, and changing pattern rules for the dummy pattern so that the density will be desired values.

In addition, in order to achieve the above object, an apparatus for designing a semiconductor device which inserts a dummy pattern between design patterns is provided. This apparatus for designing a semiconductor device comprises a dividing section for dividing a layout pattern for a layout layer in a semiconductor device into divided areas, an inserting section for inserting a dummy pattern between design patterns in the divided areas, a calculating section for calculating the density of the dummy pattern and the design patterns in each of the divided areas, and a changing section for changing pattern rules for the dummy pattern so that the density will be desired values.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

The principles underlying the present invention will now be described first with reference to the drawings.

Figure 1:
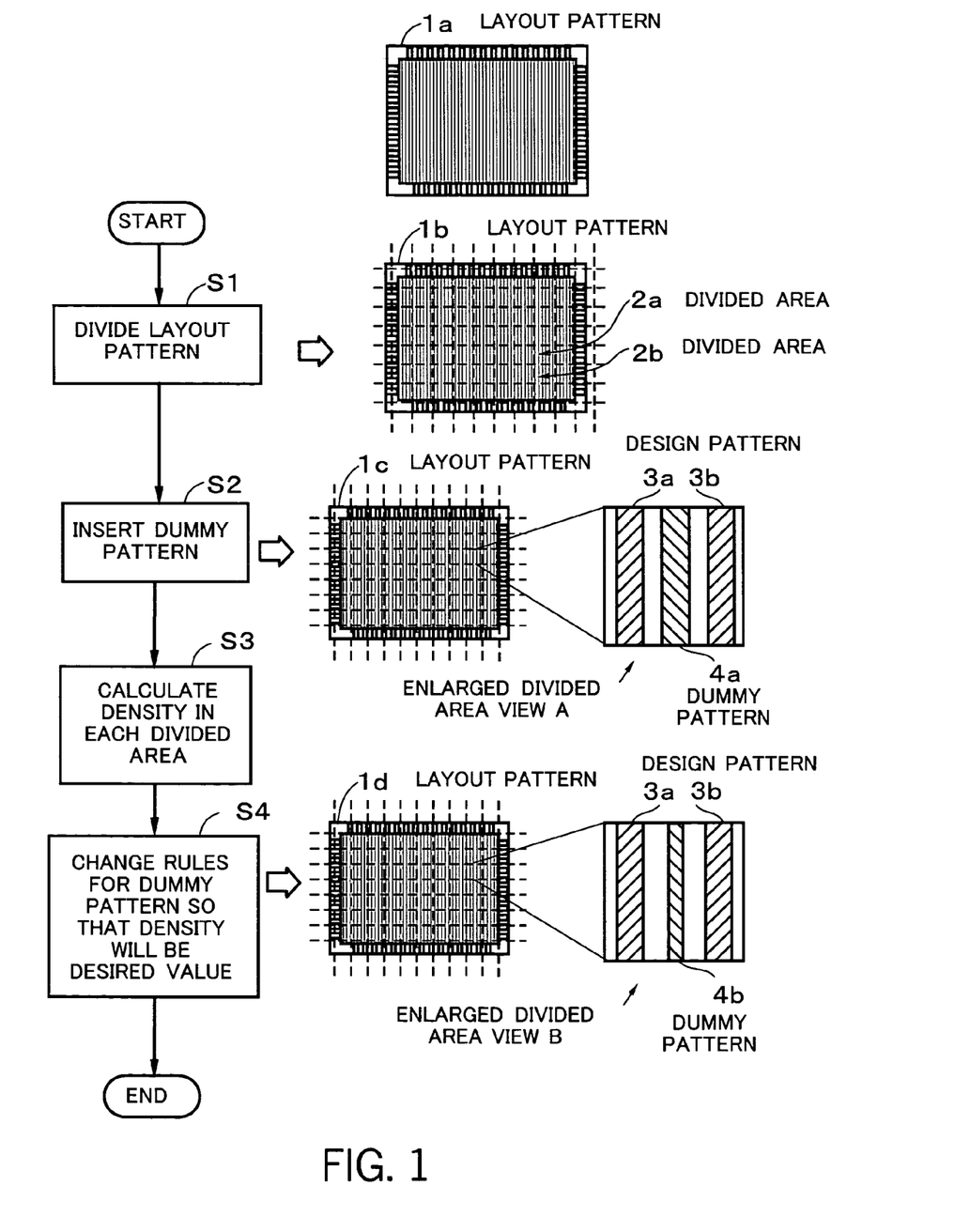
FIG. 1 is a conceptual view of the present invention.

FIG. 1 is a conceptual view of the present invention. In FIG. 1, the procedure of processes performed by a computer to realize a method for designing a semiconductor device, according to the present invention, is shown. A layout pattern 1a for a layout layer in a semiconductor chip in a semiconductor device to be designed and fabricated is also shown. A layout pattern 1b obtained by dividing the layout pattern 1a into predetermined divided areas is shown. A layout pattern 1c on which a dummy pattern has been inserted between design patterns in a divided area is shown. A layout pattern 1d on which dummy rules for a dummy pattern have been changed is shown. An enlarged divided area view A is an enlarged view of a divided area on the layout pattern 1c. An enlarged divided area view B is an enlarged view of a divided area on the layout pattern 1d.

A computer performs processes in accordance with the following procedure.

[Step S1] As shown on the layout pattern 1b, the computer divides the layout pattern 1a for a layout layer in a semiconductor chip into divided areas 2a, 2b, . . .

[Step S2] As shown in the enlarged divided area view A for the layout pattern 1c, the computer inserts a dummy pattern 4a between design patterns 3a and 3b in the divided area. The computer inserts a dummy pattern between design patterns in each divided area.

[Step S3] The computer calculates dummy pattern density and design pattern density in each divided area.

[Step S4] As shown by a dummy pattern 4b in the enlarged divided area view B for the layout pattern 1d, the computer changes pattern rules for a dummy pattern in each divided area so that the density calculated in step S3 will be desired values. Dummy rules mean wiring structure, such as the wiring width of a dummy pattern, and a position between design patterns where a dummy pattern is inserted (the arrangement of a dummy pattern).

For example, if the density calculated in step S3 is greater than the desired values, then the wiring width of a dummy pattern is narrowed to decrease dummy pattern density and design pattern density. As a result, the desired density will be obtained. If the density calculated in step S3 is smaller than the desired values, then the wiring width of a dummy pattern is expanded to increase dummy pattern density and design pattern density. As a result, the desired density will be obtained.

As described above, in the present invention a layout pattern for a semiconductor chip is divided into divided areas and a dummy pattern is inserted between design patterns in each divided area. After that dummy rules for a dummy pattern are changed so that dummy pattern density and design pattern density in each divided area will be desired values. As a result, a semiconductor device in which dummy pattern density and design pattern density are equalized on the entire semiconductor chip can be designed.

Now, an embodiment of the present invention will be described with a case where a computer is used as an example.

Figure 2:
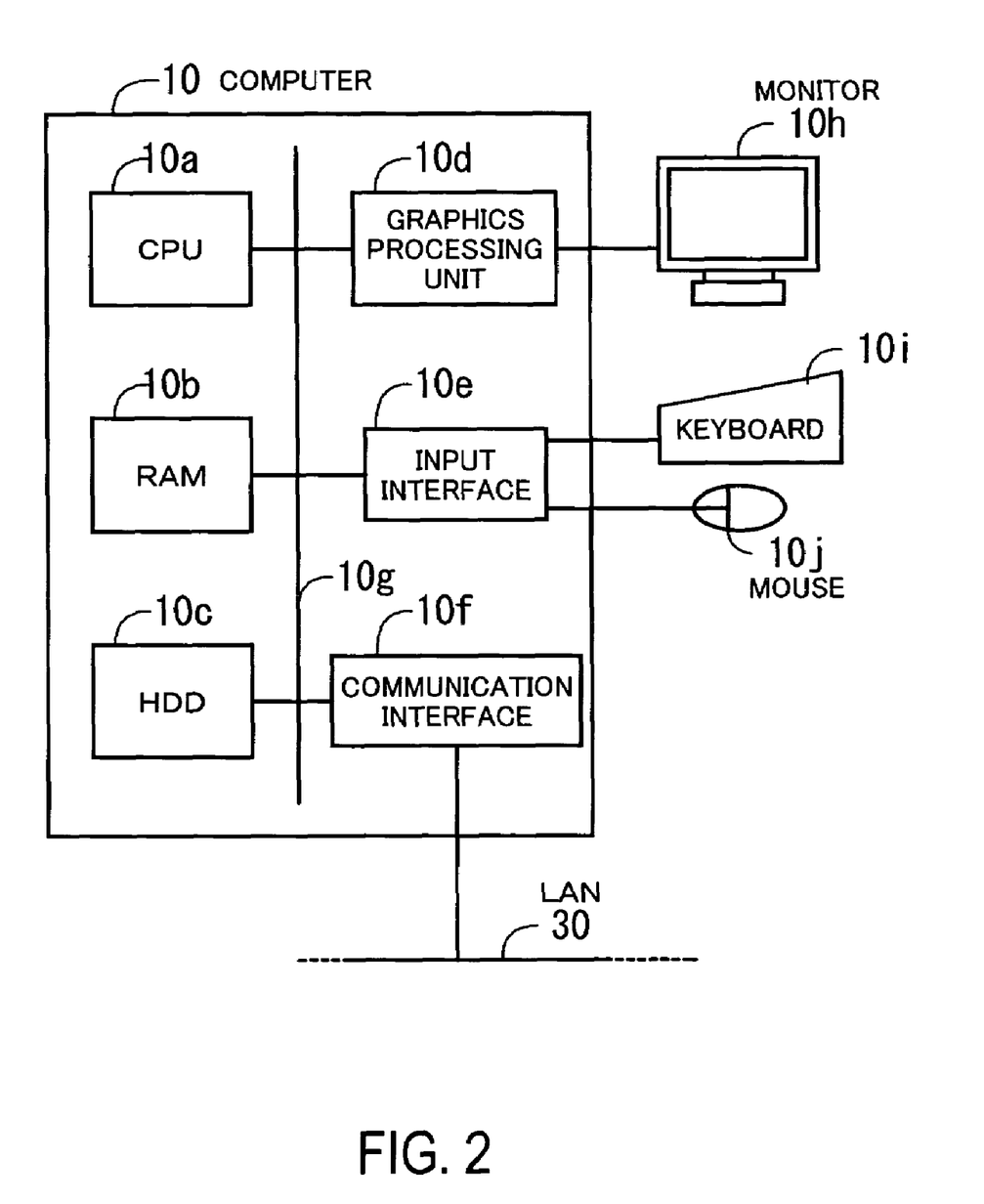
FIG. 2 is a block diagram of computer hardware.

FIG. 2 is a block diagram of computer hardware. The whole of a computer 10 is controlled by a central processing unit (CPU) 10a. A random access memory (RAM) 10b, a hard disk drive (HDD) 10c, a graphics processing unit 10d, an input interface 10e, and a communication interface 10f are connected to the CPU 10a via a bus 10g.

The RAM 10b temporarily stores at least part of an operating system (OS) program or an application program for designing a semiconductor device executed by the CPU 10a. The RAM 10b also stores various pieces of data which the CPU 10a needs to perform a process. The HDD 10c stores an OS and application programs.

A monitor 10h is connected to the graphics processing unit 10d. The graphics processing unit 10d displays an image on a display screen of the monitor 10h in accordance with instructions from the CPU 10a. A keyboard 10i and a mouse 10j are connected to the input interface 10e. The input interface 10e sends a signal sent from the keyboard 10i or the mouse 10j to the CPU 10a via the bus 10g.

The communication interface 10f is connected to other computers (not shown). The communication interface 10f exchanges data with these computers via a LAN.

By adopting the above hardware structure, the method for designing a semiconductor device according to the present invention can be realized.

Figure 3:
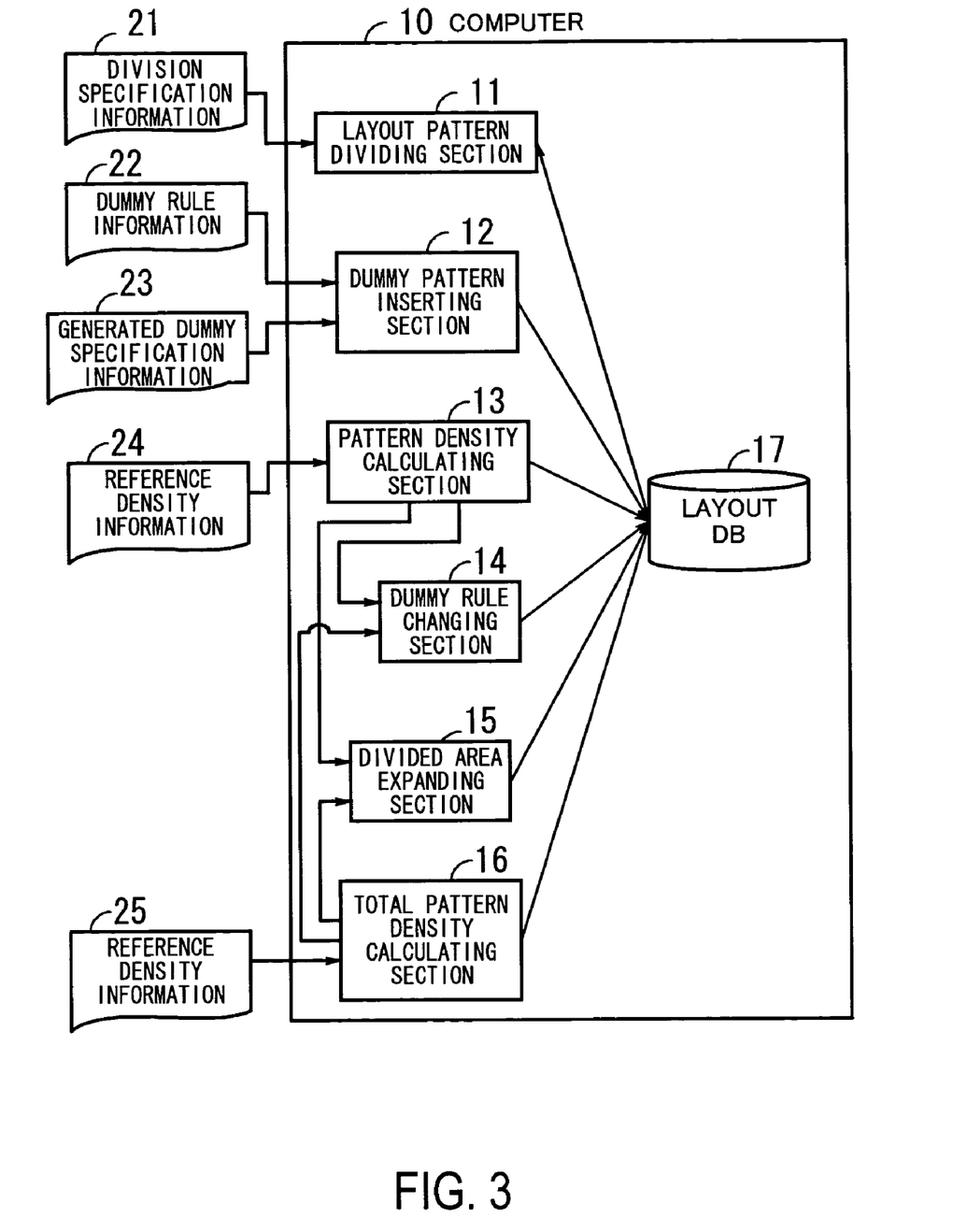
FIG. 3 is a functional block diagram of a computer.

FIG. 3 is a functional block diagram of a computer. As shown in FIG. 3, the computer 10 includes a layout pattern dividing section 11, a dummy pattern inserting section 12, a pattern density calculating section 13, a dummy rule changing section 14, a divided area expanding section 15, a total pattern density calculating section 16, and a layout DB 17.

The layout DB 17 includes a layout pattern for a wiring layer in a semiconductor chip to be designed and fabricated. The layout DB 17 corresponds to the HDD 10c or the RAM 10b shown in FIG. 2.

Division specification information 21 shown in FIG. 3 relates to the size of divided areas obtained by dividing a layout pattern. Dummy rule information 22 relates to wiring structure, such as the wiring width of a dummy pattern, and a position where a dummy pattern is inserted (the arrangement of a dummy pattern). Generated dummy specification information 23 indicates one of divided areas obtained by dividing a layout pattern where a dummy pattern should be inserted. Reference density information 24 specifies dummy pattern density and wiring pattern density in a divided area. Reference density information 25 specifies dummy pattern density and wiring pattern density on the entire layout pattern. The division specification information 21, dummy rule information 22, generated dummy specification information 23, reference density information 24, and reference density information 25 are input from the keyboard 10i for the computer 10 shown in FIG. 2.

The layout pattern dividing section 11 divides a layout pattern stored in the layout DB 17 into divided areas having the size of which is specified by the division specification information 21. To be concrete, the size (length and width) of divided areas is specified as the division specification information 21. The greatest common divisor of the length and width of a semiconductor chip is specified as the division specification information 21. Intervals at which input and output pads are located on a semiconductor chip are specified as the division specification information 21. The greatest common divisor of the length and width of RAM macro cells on a semiconductor chip is specified as the division specification information 21. The size of an area which has a high wiring pattern density may be specified as the division specification information 21.

Figure 4A:
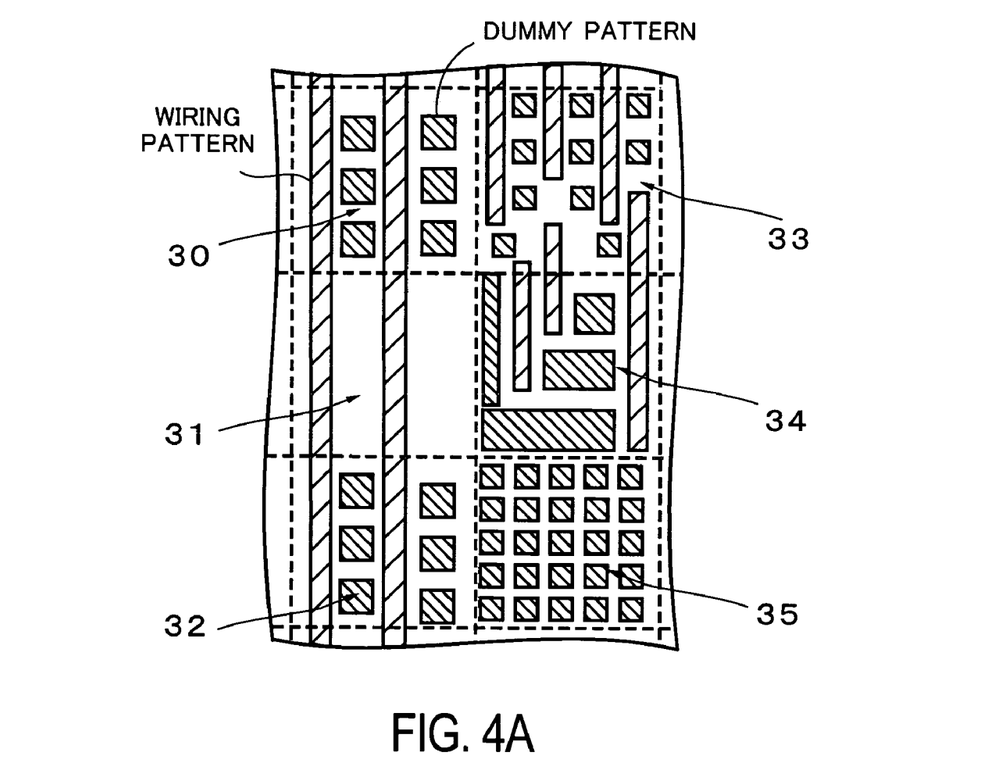
FIGS. 4A and 4B are diagrams showing the insertion of a dummy pattern, FIG. 4A being a diagram showing the insertion of a dummy pattern in a divided area, FIG. 4B being a diagram showing the insertion of a dummy pattern in an area including two adjacent divided areas.
Figure 4B:
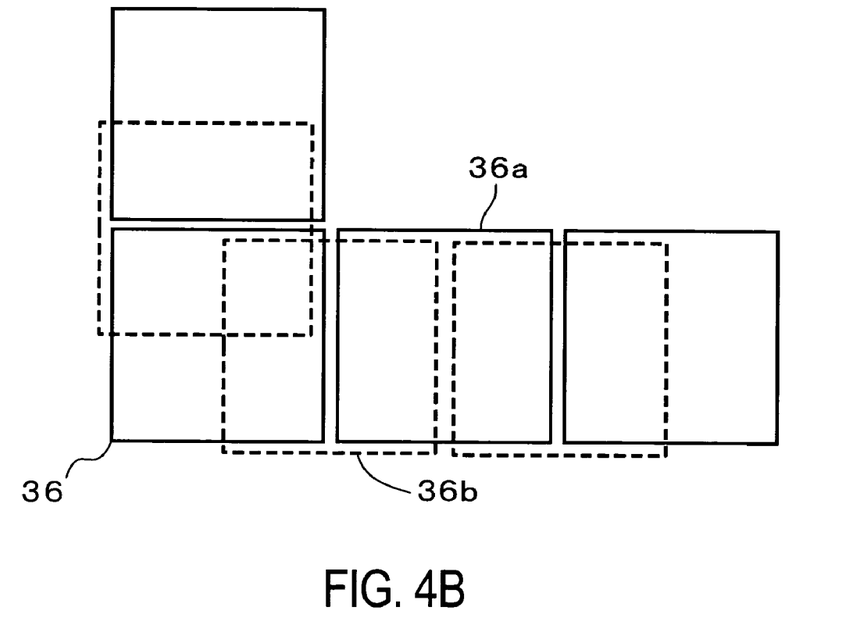

The dummy pattern inserting section 12 inserts a dummy pattern in a divided area obtained by the layout pattern dividing section 11 dividing a layout pattern. The dummy pattern inserting section 12 inserts a dummy pattern based on the dummy rule information 22, that is to say, on information regarding wiring structure, such as the wiring width of the dummy pattern, and a position where the dummy pattern is inserted (the arrangement of the dummy pattern) between wiring patterns in a divided area. The dummy pattern inserting section 12 also inserts a dummy pattern in a divided area specified by the generated dummy specification information 23. FIGS. 4A and 4B are views for describing the insertion of a dummy pattern. FIG. 4A is a view for describing the insertion of a dummy pattern in a divided area. FIG. 4B is a diagram showing the insertion of a dummy pattern in an area including two adjacent divided areas.

In FIG. 4A, part of a layout pattern for a wiring layer in a semiconductor chip is shown. The layout pattern has been divided into divided areas 30 through 35 each enclosed by dotted lines. The dummy pattern inserting section 12 inserts a dummy pattern in each of the divided areas 30 through 35. In this case, the dummy pattern inserting section 12 inserts a dummy pattern only in divided areas specified by the generated dummy specification information 23. It is assumed that the generated dummy specification information 23 specifies that a dummy pattern is inserted in the divided areas 30 and 32 through 35. Then a dummy pattern will not be inserted in the divided area 31, as shown in FIG. 4A.

The dummy pattern inserting section 12 inserts a dummy pattern only in specified divided areas in this way. That is to say, divided areas where a dummy pattern is to be generated can be specified. This can prevent a dummy pattern from being inserted in an area where a change in capacitance between wiring patterns caused by the insertion of a dummy pattern should be prevented.

In FIG. 4B, a square divided area 36, a divided area 36a which is adjacent to the divided area 36 and the shape of which is the same as that of the divided area 36, and an area 36b which includes the divided areas 36 and 36a and the shape of which is the same as that of the divided area 36 are shown. When the dummy pattern inserting section 12 receives predetermined instructions by the generated dummy specification information 23, the dummy pattern inserting section 12 inserts a dummy pattern in the divided areas 36 and 36a. In addition, the dummy pattern inserting section 12 inserts a dummy pattern in the area 36b including the divided areas 36 and 36a.

As described above, the dummy pattern inserting section 12 inserts a dummy pattern in two adjacent divided areas and then inserts a dummy pattern in an area including these two adjacent divided areas. This can prevent a discontinuity from occurring between dummy patterns at the border between divided areas.

The insertion of a dummy pattern in a horizontal direction in FIG. 4B has been described. The insertion of a dummy pattern in a vertical direction in FIG. 4B will be performed in the same way. That is to say, the dummy pattern inserting section 12 inserts a dummy pattern in two adjacent divided areas and then inserts a dummy pattern in an area including these two adjacent divided areas.

The pattern density calculating section 13 calculates dummy pattern density and wiring pattern density (pattern density) in each divided area on a layout pattern. The pattern density calculating section 13 judges whether or not the calculated pattern density and density indicated in the reference density information 24 match.

The total pattern density calculating section 16 calculates pattern density on the entire layout pattern and judges whether or not the pattern density and density indicated in the reference density information 25 match.

If the pattern density calculating section 13 judges that the calculated pattern density and density indicated in the reference density information 24 do not match, then the dummy rule changing section 14 changes dummy rules for a dummy pattern in a divided area where they do not match. Moreover, if the total pattern density calculating section 16 judges that pattern density it calculated and density indicated in the reference density information 25 do not match, then the dummy rule changing section 14 changes dummy rules for dummy patterns on the entire layout pattern. For example, the dummy rule changing section 14 uniformly changes dummy rules for a dummy pattern in each divided area. If pattern density is smaller than a desired value, then the size of a dummy pattern in each divided area will be increased at the same rate. If pattern density is greater than a desired value, then the size of a dummy pattern in each divided area will be reduced at the same rate.

Figure 5A:
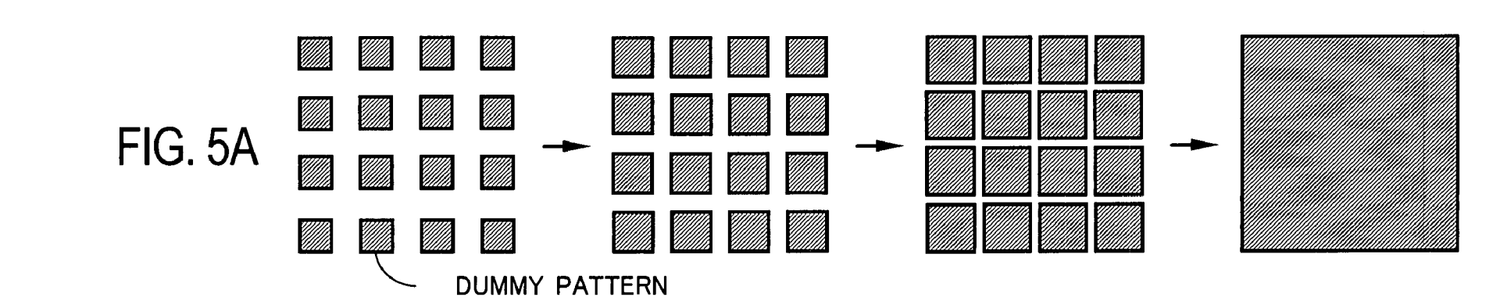
FIGS. 5A, 5B and 5C are diagrams showing changes in the size and arrangement of dummy patterns, FIG. 5A being a diagrams showing a change in the size of the dummy patterns, FIG. 5B being a view for describing a reduction in the number of the dummy patterns, and FIG. 5C being a view for describing the addition of dummy patterns.
Figure 5B:
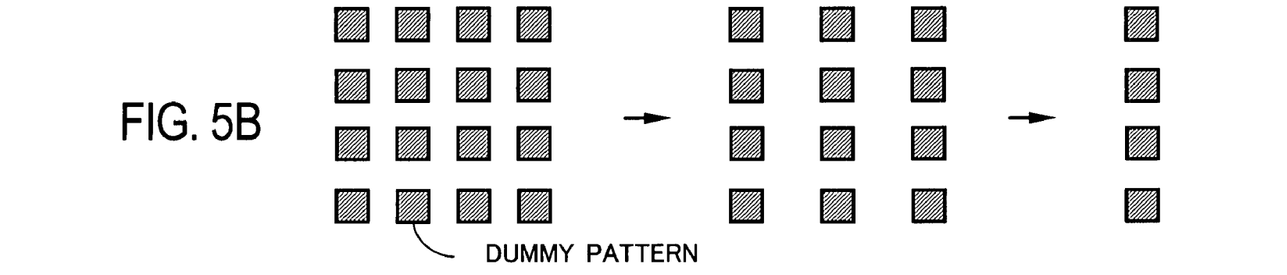
Figure 5C:
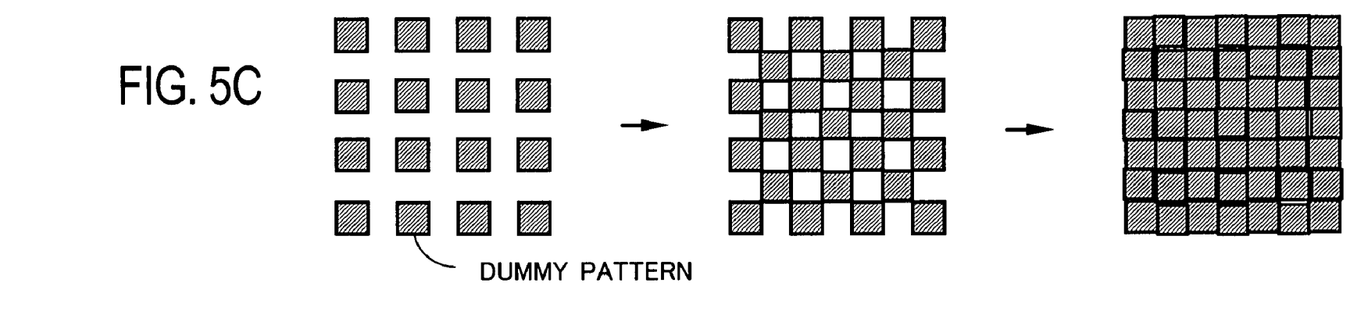

Moreover, the dummy rule changing section 14 judges whether or not it has changed dummy rules for a dummy pattern a predetermined number of times. Only if the dummy rule changing section 14 judges that it has not changed dummy rules for a dummy pattern the predetermined number of times, it changes dummy rules. This prevents a dummy pattern from becoming larger or smaller than is needed as a result of changing dummy rules many times. FIGS. 5A, 5B and 5C are diagrams showing changes in dummy rule. FIG. 5A is a view for describing a change in the size of dummy patterns. FIG. 5B is a diagram showing a reduction in the number of the dummy patterns. FIG. 5C is a diagram showing the addition of dummy patterns.

It is assumed that dummy patterns shown in the leftmost illustration in FIG. 5A have been inserted in a divided area on a layout pattern. If the pattern density calculating section 13 judges that the pattern density of the dummy patterns is lower than density indicated in the reference density information 24, then the dummy rule changing section 14 will make the area of the dummy patterns larger. As shown in order by arrows, the dummy rule changing section 14 performs this operation until desired density is obtained. By contrast, if the pattern density calculating section 13 judges that the pattern density of the dummy patterns is higher than density indicated in the reference density information 24, then the dummy rule changing section 14 will make the area of the dummy patterns smaller. However, this is not shown in FIG. 5.

It is assumed that dummy patterns shown in the leftmost illustration in FIG. 5B have been inserted in a divided area on a layout pattern. If the pattern density calculating section 13 judges that the pattern density of the dummy patterns is higher than density indicated in the reference density information 24, then the dummy rule changing section 14 will reduce the number of the dummy patterns. As shown in order by arrows, the dummy rule changing section 14 performs this operation until desired density is obtained.

It is assumed that dummy patterns shown in the leftmost illustration in FIG. 5C have been inserted in a divided area on a layout pattern. If the pattern density calculating section 13 judges that the pattern density of the dummy patterns is lower than density indicated in the reference density information 24, then the dummy rule changing section 14 will add dummy patterns. As shown in order by arrows, the dummy rule changing section 14 performs this operation until desired density is obtained.

In FIGS. 5A through 5C the shape of the dummy patterns is square, but in reality the size or arrangement of dummy patterns having the shape of which depends on the dummy rule information 22 will be changed.

Figure 6A:
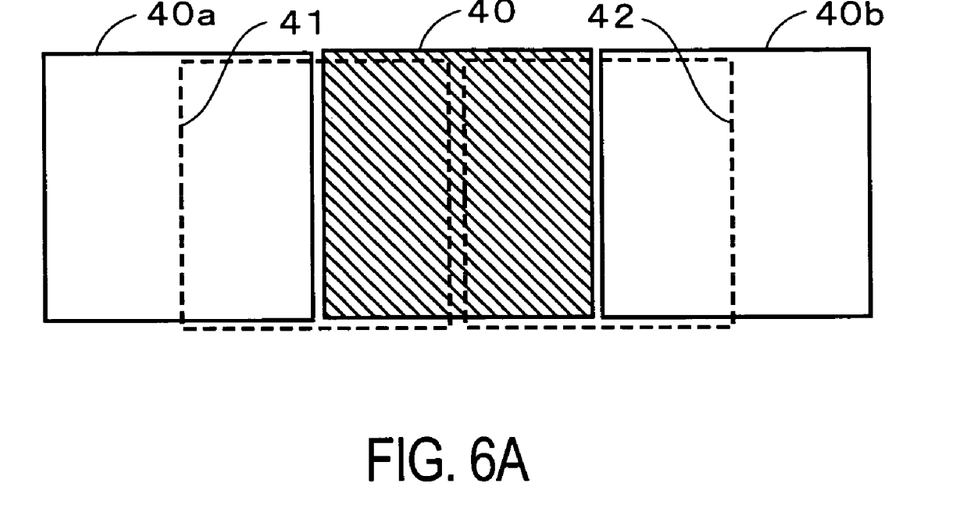
FIGS. 6A and 6B are diagrams showing a criterion for calculating pattern density, FIG. 6A being a view for describing a case where an area including two adjacent divided areas is a criterion for calculating pattern density, FIG. 6B being a diagram showing a case where an enlarged divided area is a criterion for calculating pattern density.
Figure 6B:
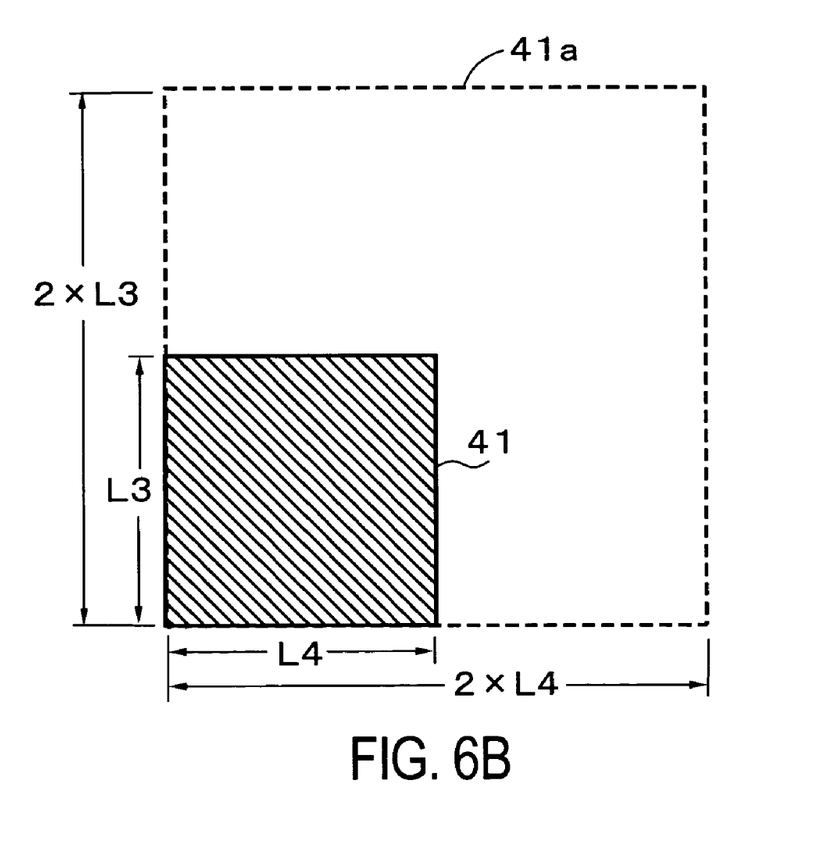

Though the dummy rule changing section 14 has changed the size or arrangement of dummy patterns a predetermined number of times, desired pattern density (density indicated in the reference density information 24 and 25) may not be obtained. In this case, the divided area expanding section 15 changes a criterion used by the pattern density calculating section 13 for calculating pattern density. That is to say, the divided area expanding section 15 changes the size or arrangement of divided areas, being a criterion for calculating pattern density. FIGS. 6A and 6B are diagrams showing a criterion for calculating pattern density. FIG. 6A is a diagram showing a case where an area including two adjacent divided areas is a criterion for calculating pattern density. FIG. 6B is a diagram showing a case where an enlarged divided area is a criterion for calculating pattern density.

It is assumed that even though the size or arrangement of dummy patterns in a square divided area 40 shown in FIG. 6A has been changed a predetermined number of times, desired pattern density is not obtained. Then the divided area expanding section 15 considers an area 41 including the divided area 40 and a divided area 40a adjacent to the divided area 40 and an area 42 including the divided area 40 and a divided area 40b adjacent to the divided area 40 as a criterion for calculating pattern density. If the desired pattern density is obtained in the areas 41 and 42 and not in the divided area 40, then the judgment that the desired pattern density is obtained in the divided area 40 will be made.

That is to say, if the desired pattern density is obtained in areas each including the divided area 40 and a divided area adjacent to the divided area 40, then the judgment that the desired pattern density is obtained in the divided area 40 will be made.

It is assumed that though the size or arrangement of dummy patterns in a square divided area 41 shown in FIG. 6B has been changed a predetermined number of times, desired pattern density is not obtained. Then the divided area expanding section 15 considers an area 41a obtained by multiplying each of the lengths L3 and L4 of sides of the divided area 41 and an integer (two in FIG. 6B) together as a criterion for calculating pattern density. If the desired pattern density is obtained in the area 41a and not in the divided area 41, then the judgment that the desired pattern density is obtained in the divided area 41 will be made.

That is to say, if the desired pattern density is obtained in an area obtained by enlarging the divided area 41, then the judgment that the desired pattern density is obtained in the divided area 41 will be made.

The total pattern density calculating section 16 calculates pattern density on the entire layout pattern and judges whether or not the pattern density and density indicated in the reference density information 25 match. If the total pattern density calculating section 16 judges that they do not match, then the dummy rule changing section 14 changes dummy rules for dummy patterns. For example, the dummy rule changing section 14 uniformly changes dummy rules for a dummy pattern in each divided area. If they do not match even after dummy rules having been changed a predetermined number of times, then the divided area expanding section 15 changes a criterion for calculating pattern density.

Now, the flow of processes on the functional block diagram shown in FIG. 3 will be described by the use of a flow chart.

Figure 7:
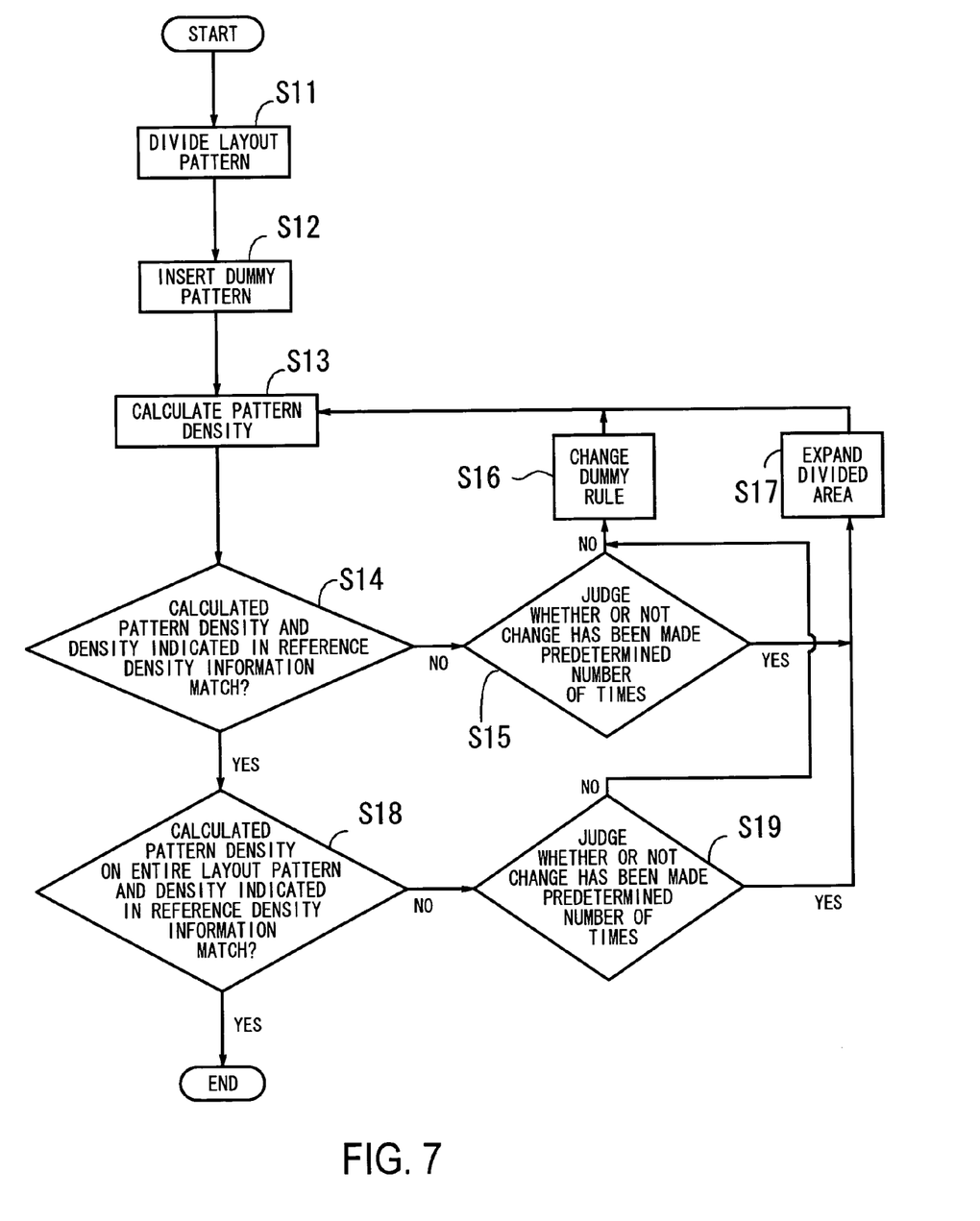
FIG. 7 is a flow chart showing the flow of processes performed by a computer.

FIG. 7 is a flow chart showing the flow of processes performed by a computer. The computer 10 designs a semiconductor device in the following step order.

[Step S11] The layout pattern dividing section 11 in the computer 10 divides a layout pattern stored in the layout DB 17 into divided areas having the size of which is specified by the division specification information 21.

[Step S12] The dummy pattern inserting section 12 in the computer 10 inserts a dummy pattern in a divided area obtained by the layout pattern dividing section 11 dividing the layout pattern. The dummy pattern inserting section 12 inserts a dummy pattern based on the dummy rule information 22 in a divided area. The dummy pattern inserting section 12 also inserts a dummy pattern in a divided area specified by the generated dummy specification information 23.

[Step S13] The pattern density calculating section 13 in the computer 10 calculates pattern density in each divided area.

[Step S14] The pattern density calculating section 13 in the computer 10 judges whether or not the calculated pattern density and density indicated in the reference density information 24 match. If they match, then step S18 will be performed. If they do not match, then step S15 will be performed.

[Step S15] The dummy rule changing section 14 in the computer 10 judges whether or not it has changed dummy rules for a dummy pattern in a divided area where pattern density calculated by the pattern density calculating section 13 and density indicated in the reference density information 24 did not match a predetermined number of times. If the dummy rule changing section 14 judges that it has made a change the predetermined number of times, then step S17 will be performed. If the dummy rule changing section 14 judges that it has not made a change the predetermined number of times, then step S16 will be performed.

[Step S16] The dummy rule changing section 14 in the computer 10 changes dummy rules for a dummy pattern. Afterward, step S13 will be performed. In step S13, the pattern density calculating section 13 calculates the pattern density of a dummy pattern dummy rules for which have been changed.

[Step S17] The divided area expanding section 15 in the computer 10 changes the arrangement or size of divided areas, being a criterion for calculating pattern density. Afterward, step S13 will be performed. In step S13, the pattern density calculating section 13 calculates pattern density in divided areas the arrangement or size of which has been changed.

[Step S18] The total pattern density calculating section 16 in the computer 10 calculates pattern density on the entire layout pattern and judges whether or not the pattern density and density indicated in the reference density information 25 match. If they match, then the computer 10 will terminate the procedure. If they do not match, then step S19 will be performed.

[Step S19] The dummy rule changing section 14 in the computer 10 judges whether or not it has changed dummy rules for dummy patterns on the entire layout pattern a predetermined number of times. If the dummy rule changing section 14 judges that it has made a change the predetermined number of times, then step S17 will be performed. If the dummy rule changing section 14 judges that it has not made a change the predetermined number of times, then step S16 will be performed.

As described above, a layout pattern is divided into divided areas and a dummy pattern is inserted between wiring patterns in each divided area. Pattern density in each divided area is calculated. Dummy rules for an inserted dummy pattern are changed so that desired pattern density will be obtained. As a result, a semiconductor device in which pattern density is equalized on the entire semiconductor chip can be designed.

Moreover, a divided area where a dummy pattern is to be generated can be specified. This can prevent a dummy pattern from being inserted in an area where a change in capacitance between wiring patterns caused by the insertion of a dummy pattern should be prevented.

In addition, a dummy pattern is inserted in two adjacent divided areas and then a dummy pattern is inserted in an area including these two adjacent divided areas. This can prevent a discontinuity from occurring between dummy patterns at the border between divided areas. Therefore, a semiconductor device in which pattern density on a semiconductor chip is equalized can be designed.

In the above embodiment the descriptions have been given with a wiring pattern for a wiring layer as an example, but the present invention is not limited to this case. That is to say, the present invention is applicable to design patterns for all layout layers included in a semiconductor device. For example, the present invention is applicable to a design pattern for a layer on a semiconductor substrate where transistors are to be located.

A program in which the contents of the functions the computer 10 should have are described is provided. By executing this program on a computer, the above functions are realized on the computer. This program can be recorded on a computer readable record medium. A computer readable record medium can be a magnetic recording device, an optical disk, a magneto-optical recording medium, a semiconductor memory, or the like. A magnetic recording device can be a hard disk drive (HDD), a flexible disk (FD), a magnetic tape, or the like. An optical disk can be a digital versatile disc (DVD), a digital versatile disc random access memory (DVD-RAM), a compact disc read only memory (CD-ROM), a compact disc recordable (CD-R)/rewritable (CD-RW), or the like. A magneto-optical recording medium can be a magneto-optical disc (MO) or the like.

To place the program on the market, portable record media, such as DVDs or CD-ROMs, on which it is recorded are sold. Alternatively, the program is stored in advance on a hard disk in a server computer and is transferred to another computer via a network.

When a computer executes this program, it will store the program, which is recorded on a portable record medium or which is transferred from a server computer, on, for example, its hard disk. Then it reads the program from its hard disk and performs processes in compliance with the program. A computer can also read the program directly from a portable record medium and perform processes in compliance with the program. Furthermore, each time the program is transferred from a server computer, a computer can perform processes in turn in compliance with the program it received.

As has been described in the foregoing, in the present invention a layout pattern for a layout layer in a semiconductor device is divided into predetermined divided areas and a dummy pattern is inserted between design patterns in each divided area. Dummy pattern density and design pattern density in each divided area are calculated. Pattern rules for a dummy pattern are changed so that desired density values will be obtained. As a result, a semiconductor device in which dummy pattern density and design pattern density are equalized on the entire semiconductor chip can be designed.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method for designing a semiconductor having a computer for inserting a dummy pattern between design patterns, the method comprising the steps of:
dividing a layout pattern for a layout layer in a semiconductor device into divided areas;
inserting a dummy pattern between design patterns in the divided areas;
calculating the density of the dummy pattern and the design patterns in each of the divided areas; and
changing pattern rules for the dummy pattern so that the density will be desired values.

2. The method for designing a semiconductor device according to claim 1, wherein the design patterns are wiring patterns and the layout layer is a wiring layer.

3. The method for designing a semiconductor device according to claim 1, wherein:
division specification information regarding size of the divided areas is accepted; and
the layout pattern is divided into divided areas having the size of which is specified by the division specification information.

4. The method for designing a semiconductor device according to claim 1, wherein:
generated dummy specification information regarding the specification of the divided area in which the dummy pattern is to be inserted is accepted; and
the dummy pattern is inserted between design patterns in the divided area specified by the generated dummy specification information.

5. The method for designing a semiconductor device according to claim 1, wherein:
dummy rule information regarding pattern rules for the dummy pattern inserted between the design patterns is accepted; and
the dummy pattern having the pattern rules for which are based on the dummy rule information is inserted between the design patterns.

6. The method for designing a semiconductor device according to claim 1, wherein the dummy pattern is inserted between design patterns in an area including the divided area and a divided area adjacent to the divided area.

7. The method for designing a semiconductor device according to claim 1, wherein if the density does not match the desired values, the density of the dummy pattern and the design patterns in an area obtained by enlarging the divided area where the density was calculated is calculated.

8. The method for designing a semiconductor device according to claim 1, wherein if the density does not match the desired values, the density of the dummy pattern and the design patterns in an area including the divided area where the density was calculated and a divided area adjacent to the divided area is calculated.

9. The method for designing a semiconductor device according to claim 1, wherein the density of design patterns and dummy patterns on the entire layout pattern is calculated.

10. A program for designing a semiconductor device which inserts a dummy pattern between design patterns, the program making a computer perform the processes of:
dividing a layout pattern for a layout layer in a semiconductor device into divided areas;
inserting a dummy pattern between design patterns in the divided areas;
calculating the density of the dummy pattern and the design patterns in each of the divided areas; and
changing pattern rules for the dummy pattern so that the density will be desired values.

11. A computer-readable record medium which stores a program for designing a semiconductor device which inserts a dummy pattern between design patterns, the program making a computer perform the processes of:

dividing a layout pattern for a layout layer in a semiconductor device into divided areas;

inserting a dummy pattern between design patterns in the divided areas;

calculating the density of the dummy pattern and the design patterns in each of the divided areas; and changing pattern rules for the dummy pattern so that the density will be desired values.

12. An apparatus for designing a semiconductor device which inserts a dummy pattern between design patterns, the apparatus comprising:

a dividing section for dividing a layout pattern for a layout layer in a semiconductor device into divided areas;

an inserting section for inserting a dummy pattern between design patterns in the divided areas;

a calculating section for calculating the density of the dummy pattern and the design patterns in each of the divided areas; and a changing section for changing pattern rules for the dummy pattern so that the density will be desired values.

* * * * *